United States Patent
Funaya

(10) Patent No.: US 12,152,997 B2
(45) Date of Patent: Nov. 26, 2024

(54) METHOD FOR PREDICTING RELIABILITY OF SEMICONDUCTOR DEVICE

(71) Applicant: RENESAS ELECTRONICS CORPORATION, Tokyo (JP)

(72) Inventor: Takuo Funaya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 457 days.

(21) Appl. No.: 17/587,357

(22) Filed: Jan. 28, 2022

(65) Prior Publication Data

US 2022/0260504 A1    Aug. 18, 2022

(30) Foreign Application Priority Data

Feb. 12, 2021    (JP) .................................. 2021-020510

(51) Int. Cl.
  *G01N 21/95*  (2006.01)
  *G01N 21/88*  (2006.01)
  *H01L 23/00*  (2006.01)
(52) U.S. Cl.
  CPC ..... *G01N 21/9505* (2013.01); *G01N 21/8851* (2013.01); *H01L 24/48* (2013.01); *H01L 2224/48824* (2013.01); *H01L 2924/05432* (2013.01); *H01L 2924/37002* (2013.01)

(58) Field of Classification Search
None
See application file for complete search history.

(56) References Cited

U.S. PATENT DOCUMENTS

| | | | |
|---|---|---|---|
| 5,291,419 A * | 3/1994 | Satoh | G01N 3/00 702/34 |
| 2016/0162616 A1* | 6/2016 | Hasan | H02S 50/10 703/2 |
| 2020/0117846 A1* | 4/2020 | Hongo | G01M 5/0033 |

FOREIGN PATENT DOCUMENTS

JP    2019-057664 A    4/2019

* cited by examiner

*Primary Examiner* — Raymond L Nimox
(74) *Attorney, Agent, or Firm* — Rimon P.C.

(57) ABSTRACT

A reliability prediction method includes: calculating a change of each of a plurality of alloy phases at a bonding portion between an electrode pad and a bonding wire; setting a generation of a metal oxide phase caused by a corrosion reaction, based on an initial crack structure of the bonding portion; calculating an elastic strain energy at each of specified portions of the bonding portion; setting a progress of a crack, based on the elastic strain energy at each of the specified portions; and predicting a lifetime of the semiconductor device, based on a length of the crack due to the progress of the crack.

11 Claims, 14 Drawing Sheets

METHOD FOR PREDICTING RELIABILITY OF SEMICONDUCTOR DEVICE

CROSS-REFERENCE TO RELATED APPLICATIONS

The disclosure of Japanese Patent Application No. 2021-020510 filed on Feb. 12, 2021 including the specification, drawings and abstract is incorporated herein by reference in its entirety.

BACKGROUND

The present invention relates to a reliability prediction technique of a semiconductor device, for example, to a technique for predicting a reliability of a bonding portion between an electrode pad and a bonding wire.

There is disclosed technique listed below.
[Patent Document 1] Japanese Unexamined Patent Application Publication No. 2019-57664

A technique for improving the reliability of the bonding portion between the electrode pad and the bonding wire is described in Patent Document 1.

SUMMARY

In developing a semiconductor device, an accelerated reliability test (HTSL: High Temperature Storage Life) has been conducted to ensure the reliability of the semiconductor device. In particular, a semiconductor device for an in-vehicle application and a semiconductor device for an industrial application are required to pass a long-term accelerated reliability test at a high temperature, as a high reliability is required to them compared to a semiconductor device for other applications.

In this regard, for example, in the current technology, it is performed to estimate a lifetime by an electric test after performing the accelerated reliability test until a strict criterion in order to realize a lifetime satisfying the strict criterion.

However, the above technique requires to perform the accelerated reliability test for a long time in order to estimate the lifetime, thereby preventing to shorten a developing time of the semiconductor device. In particular, in a product development of the semiconductor device, it is essential to respond quickly to the demands of the marketplace, and it is desirable to shorten the development time of the semiconductor device. In other words, if a technique to predict the lifetime of the semiconductor device can be established without conducting a long-term accelerated reliability test until the criterion, it is considered that the development time of the semiconductor device can be significantly shortened. Therefore, a technique that can predict the lifetime of the semiconductor device without relying on the long-term accelerated reliability test until criterion is desired.

A method for predicting a reliability of a semiconductor device according to one embodiment, includes: calculating a change of each of a plurality of alloy phases at a bonding portion between an electrode pad and a bonding wire; setting a generation of a metal oxide phase caused by a corrosion reaction, based on an initial crack structure of the bonding portion; calculating an elastic strain energy at each of specified portions of the bonding portion; setting a progress of a crack, based on the elastic strain energy at each of the specified portions; and predicting a lifetime of the semiconductor device, based on a length of the crack due to the progress of the crack.

According to one embodiment, the lifetime of the semiconductor device can be predicted.

DETAILED DESCRIPTION

Figure 1:
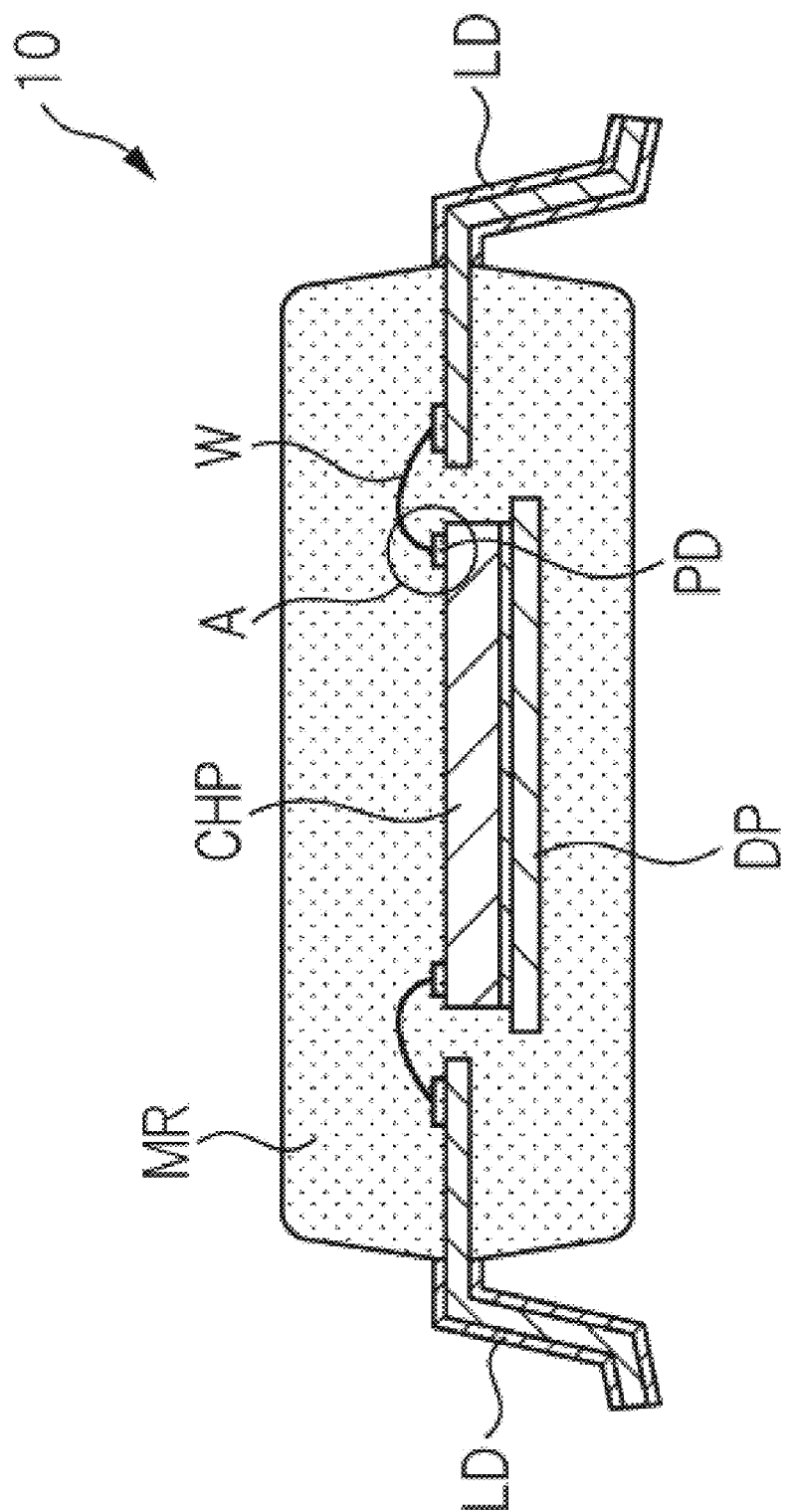
FIG. 1 is a cross-sectional view showing a configuration of a semiconductor device.

In all the drawings for explaining the embodiments, the same members are denoted by the same reference numerals in principle, and repetitive descriptions thereof are omitted. Note that even plan view may be hatched for the sake of clarity.

<Configuration of Semiconductor Device>

FIG. 1 is a cross-sectional view showing a configuration of a semiconductor device.

In FIG. 1, the semiconductor device 10 has a chip mounting portion DP, on the chip mounting portion DP, for example, a semiconductor chip CHP is mounted via an adhesive.

The semiconductor chip CHP, an integrated circuit is formed. Specifically, the semiconductor chip CHP has a semiconductor substrate, a plurality of field effect transistors formed on the main surface of semiconductor substrate, and a wiring layer formed on semiconductor substrate, in this wiring layer, a plurality of wires electrically connected to the field effect transistor is formed. In the semiconductor chip CHP thus configured, a plurality of integrated circuits constituted by connecting a plurality of field effect transistors and a plurality of wires are formed. A CPU, a RAM, an analog circuit, a nonvolatile memory, or the like is realized by the plurality of integrated circuits.

Next, as shown in FIG. 1, the semiconductor chip CHP, a pad PD which is electrically connected to the integrated circuit is formed, the pad PD is electrically connected to the lead LD via a bonding wire W. Parts of the chip mounting portion DP, the semiconductor chip CHP, the bonding wires W, and the leads LD are sealed with a sealing body MR made of, for example, epoxy resin. In this way, semiconductor device 10 is configured.

<Configuration of Bonding Portion>

Subsequently, a description will be given of the configuration of the bonding portion between the pad PD and the bonding wire W formed in the semiconductor chip CHP.

Figure 2:
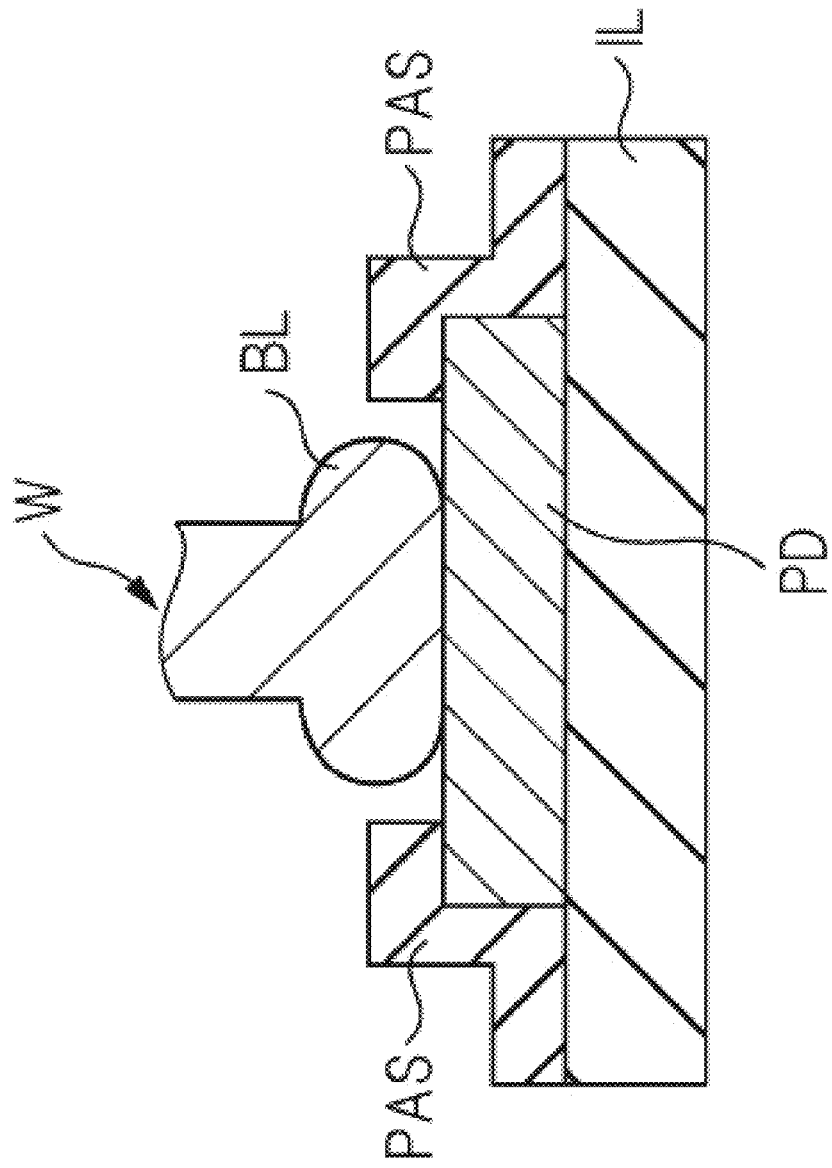
FIG. 2 is an enlarged view of a partial region shown in FIG. 1.

FIG. 2 is an enlarged view of a partial region A shown in FIG. 1.

In FIG. 2, a pad PD is formed on the insulating layer IL, and a passivation film PAS as a surface protective film is formed so as to cover the pad PD. A part of the surface of the pad PD is exposed from the passivation film PAS, and the ball portion BL as a part of the bonding wire W is connected to the exposed surface of the pad PD. In this manner, a bonding portion is formed between the ball portion BL, which is a part of the bonding wire W, and the pad PD. For example, the diameter of the ball portion BL is 39 µm, and the diameter in the cross section of the bonding portion is 30 µm by observation of the actual bonding portion.

Here, the insulating layer IL is formed of, for example, a silicon oxide film, and the passivation film PAS is formed of, for example, a silicon nitride film.

Further, the pad PD is made of a material containing aluminum as a main component. By "material containing aluminum as a main component" is meant that the material most contained in the material constituting the pad PD is aluminum, and it is intended that the material constituting the pad PD may include a component other than aluminum. In other words, the expression "a material containing aluminum as a main component" is basically used with the intention of expressing that the pad PD is composed of aluminum, but may contain other elemental components.

Further, the bonding wire W including the ball portion BL is made of a material containing copper as a main component. "Copper-based material" means that copper is the most common material included in the materials constituting the bonding wire W, and it is intended that the material constituting the bonding wire W may include components other than copper. That is, the expression "a material containing copper as a main component" is used for the purpose of expressing that the bonding wire W is basically made of copper, but may contain other elemental components.

<Factors that Decrease Reliability of Bonding Portion>

The reliability of the bonding portion between the pad PD and the bonding wire W is important to ensure the electrical connection between the pad PD and the bonding wire W. Because, when the reliability of the bonding portion is reduced, it becomes impossible to ensure electrical connection between the pad PD and the bonding wire W. For example, it is known that as time elapses, a crack generated at the bonding portion between the pad PD and the bonding wire W grows. Then, when the crack generated in the bonding portion is grown, due to this crack, so that the electrical connection between the pad PD and the bonding wire W is inhibited, thereby semiconductor device is not normal operation. In other words, crack growth at the bonding portion is a critical factor in determining the lifetime of the semiconductor device, and it is essential to understand the mechanism of crack growth at the bonding portion in order to estimate the lifetime of the semiconductor device.

<Growth Mechanism of Crack>

In this regard, the present inventor has deduced the following crack growth mechanism as a result of intensive studies, and therefore, this mechanism will be described.

Figure 3:
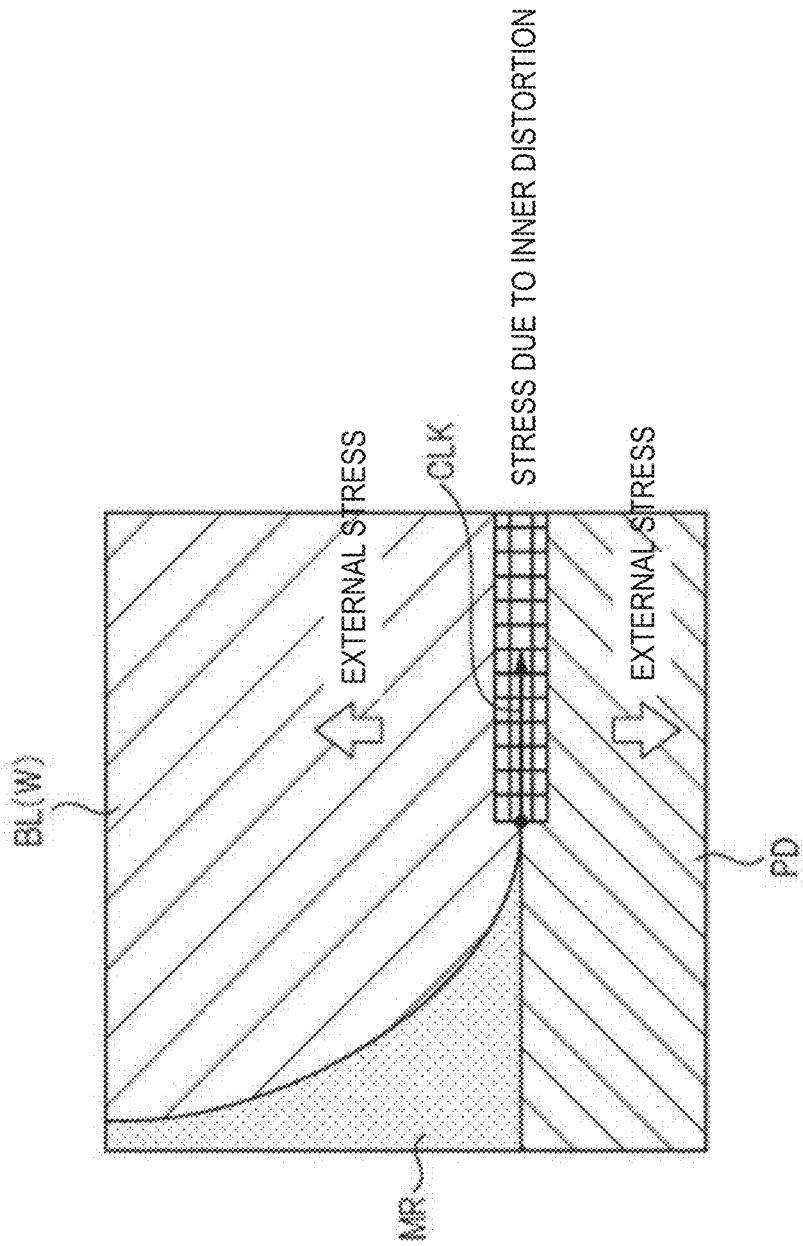
FIG. 3 is a diagram showing by enlarging a bonding portion between a pad and a bonding wire.

FIG. 3 is a diagram showing by enlarging the bonding portion between the pad and the bonding wire.

In FIG. 3, the bonding portion between the pad PD and the bonding wire W, an external stress, and a stress due to internal strain is applied. Here, the external stress, for example, the stress caused by the difference in thermal expansion coefficient between the semiconductor chip CHP and the sealing body MR in FIG. 1, the pad PD and the bonding wire W stress caused by the difference in thermal expansion coefficient is included. That is, the semiconductor chip CHP is made of silicon, while the sealing body MR is made of epoxy resin, so that the material constituting the semiconductor chip CHP and the material constituting the sealing body MR are different from each other. This means that the thermal expansion coefficient of the thermal expansion coefficient and the sealing body MR of the semiconductor chip CHP is different, thereby, the bonding portion between the pad PD and the bonding wire W, external stress is applied. Further, the bonding portion is stressed due to internal strain. This stress due to internal strain is considered to occur by the mechanism shown below. That is, the pad PD is made of a material containing aluminum as a main component, while the bonding wire W is made of a material containing copper as a main component. As a result, the bonding portion between the pad PD and the bonding wire W, an alloy phase of aluminum and copper is formed. Specifically, at the bonding portion, as an CuAl phase, "$Cu_9Al_4$ phase" and "$CuAl_2$ phase" are formed as an alloying phase of the alarm and copper. Then, since the crystallographic structure of these alloyed phases are different, at the bonding portion where "CuAl phase", "$Cu_9Al_4$ phase" and "$CuAl_2$ phase" are mixed, distortion occurs due to mismatches in the lattice and differences in the elastic modulus. As a result, stress caused by strain is generated at the bonding portion. This stress is a stress due to internal strain referred to in this specification.

In this way, as shown in FIG. 3, since the stress due to external stress and internal strain is applied to the bonding portion, cracks CLK occurs in the bonding portion in accordance with these stresses.

The present inventor have found that among a plurality of alloying phases, "$Cu_9Al_4$ phase" is involved in the growth of the crack as a new knowledge. That is, the present inventor, for example, there is an initial crack at the bonding portion, in the region where the initial crack and the "$Cu_9Al_4$ phase" is in contact, the crack-exposed region of the "$Cu_9Al_4$ phase" the aluminum oxide phase ($Al_2O_3$ phase) is formed. That is, in the aluminum oxide phase, the sulfur component contained in the resin constituting the sealing member MR becomes a hydrate, and in the situation where the sulfur component penetrates into the initial crack, the aluminum oxide phase ($Al_2O_3$ phase) due to the oxidation reaction is formed in the crack exposed region of the "$Cu_9Al_4$ phase" in the region where the initial crack contacts with the "$Cu_9Al_4$ phase". Then, the aluminum oxide phase, since it has a brittle property than the alloy phase, crack CLK is grown through the formed aluminum oxide phase. By the mechanism described above, the present inventor speculates that the crack CLK at the bonding portion will grow.

The following explains the technical philosophy of predicting the reliability of semiconductor device by simulating the crack CLK growth mechanism described above.

<Configuration of Reliability Prediction Device>

<<Hardware Configuration>>

First, the hardware configuration of the reliability prediction device in the present embodiment will be described.

Figure 4:
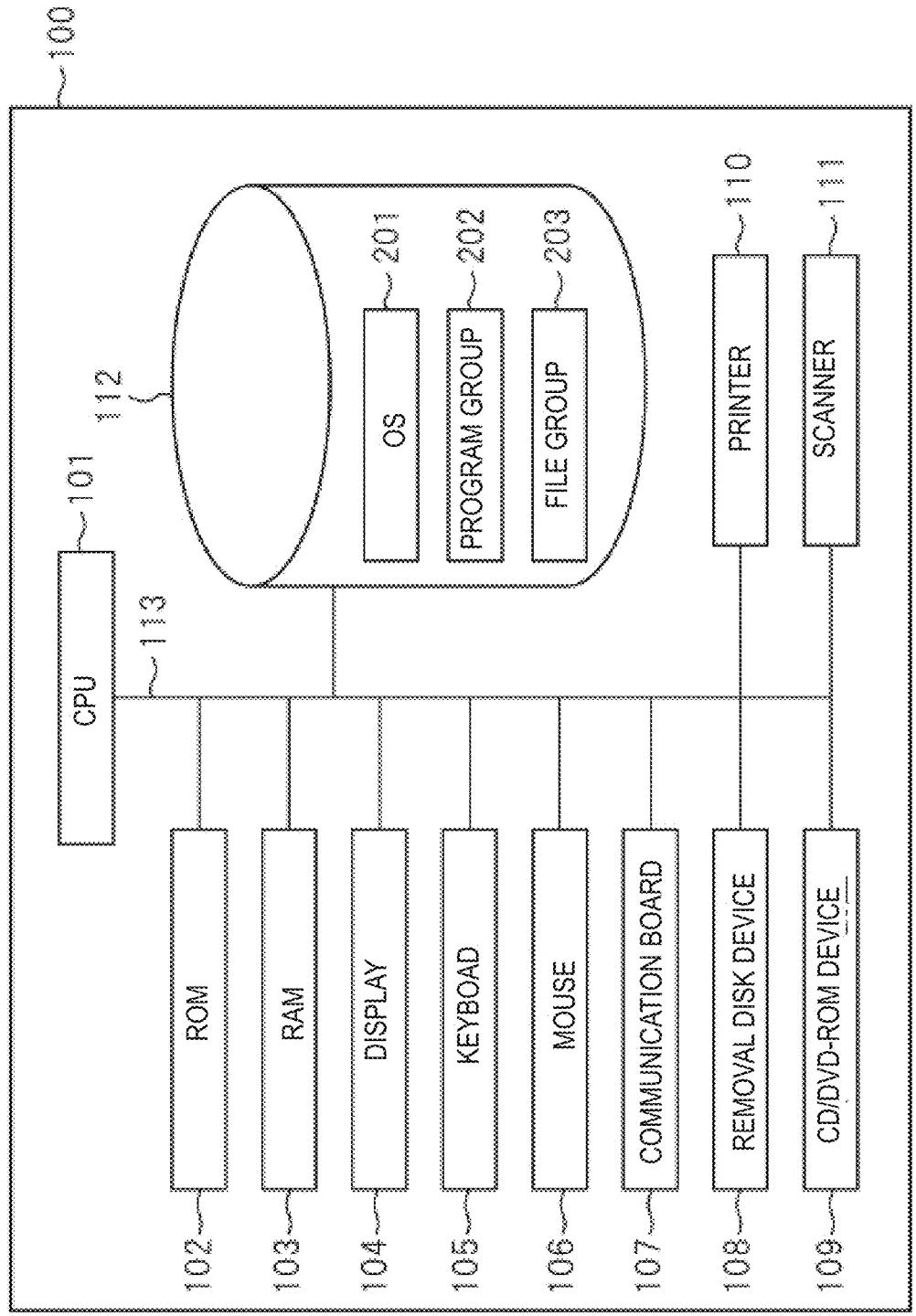
FIG. 4 is a diagram showing one example of a hardware configuration of a reliability prediction device.

FIG. 4 is a diagram showing one example of the hardware configuration 100 of the reliability prediction device. The configuration shown in FIG. 4 is merely an exemplary hardware configuration of the reliability prediction device 100, and the hardware configuration of the reliability prediction device 100 is not limited to the configuration shown in FIG. 4, and may be another configuration.

Referring to FIG. 4, a reliability prediction device 100 includes a CPU (Central Processing Unit) 101 for executing programs. CPU 101 is electronically coupled to, for example, a ROM (Read Only Memory) 102, a RAM (Random Access Memory) 103, and a hard disk device 112 via a bus 113 and is configured to control these hardware devices.

CPU 101 is also connected via a bus 113 to an input device or an output device. Examples of device include a keyboard 105, a mouse 106, a communication board 107, and a scanner 111. Examples of the output device include a display 104, a communication board 107, and a printer 110. Further, CPU 101 may be coupled to, for example, a removable disk device 108 or CD/DVD-ROM device 109.

The reliability prediction device 100 may be connected to networks, for example. For example, if the reliability prediction device 100 is connected to another external device via a network, the communication board 107 that forms part of the reliability prediction device 100 is connected to a LAN (Local Area Network), a WAN (Wide Area Network), or the Internet.

RAM 103 is an example of a volatile memory, and the recording medium of ROM 102, the removable disk device 108, CD/DVD-ROM device 109, and the hard disk device 112 is an example of a nonvolatile memory. These volatile and non-volatile memories make up the storage device of the Reliability Predictive device 100.

The hard disk device 112 stores, for example, an operating system (OS) 201, a program group 202, and a file group 203. The program included in the program group 202 is executed by CPU 101 using the operating system 201. In addition, at least a part of the program or application program of the operating system 201 to be executed by CPU 101 is temporarily stored in RAM 103, and various data required for processing by CPU 101 is stored.

ROM 102 stores a BIOS (Basic Input Output System) program, and the hard disk device 112 stores a boot program. When the reliability prediction device 100 is started, the boot program stored in ROM 102 and the boot program stored in the hard disk device 112 are executed, and BIOS program and the boot program start the operating system 201.

The program group 202 stores a program for realizing the function of the reliability prediction device 100, and the program is read and executed by CPU 101. In the file group 203, information, data, signal values, variable values, and parameters indicating the result of processing by CPU 101 are stored as items in the file.

The file is recorded on a recording medium such as a hard disk device 112 or a memory. Information, data, signal values, variable values, and parameters recorded on a recording medium such as a hard disk device 112 or a memory are read into the main memory or cache memory by a CPU 101 and used for CPU 101 operations such as extraction, search, reference, comparison, arithmetic operation, processing, editing, output, printing, and display. For example, during the operation of CPU 101 described above, information, data, signal values, variable values, and parameters are stored primarily in main memory, registers, cache memory, buffer memory, and the like.

The functions of device 100 may be realized by firmware stored in a ROM 102, or may be realized by software alone, hardware represented by elements, devices, substrate, wires, a combination of software and hardware, or a combination of firmware. The firmware and software are recorded on a recording medium such as a hard disk device 112, a removable disk, or a CD-ROM, DVD-ROM as a program. The programming is read and executed by CPU 101. That is, the program causes the computer to function as the reliability prediction device 100.

In this manner, the reliability prediction device 100 is a computer including a CPU 101 that is a processing device, a hard disk device 112 that is a memory, a keyboard 105 that is an input device, a mouse 106, a communication board 107, a display 104 that is an output device, a printer 110, and a communication board 107. The function of the reliability prediction device 100 is realized by using a process device, a storage device, an input device, and an output device.

<<Functional Block Configuration>>

Next, the functional block configuration of the reliability prediction device 100 will be described.

Figure 5:
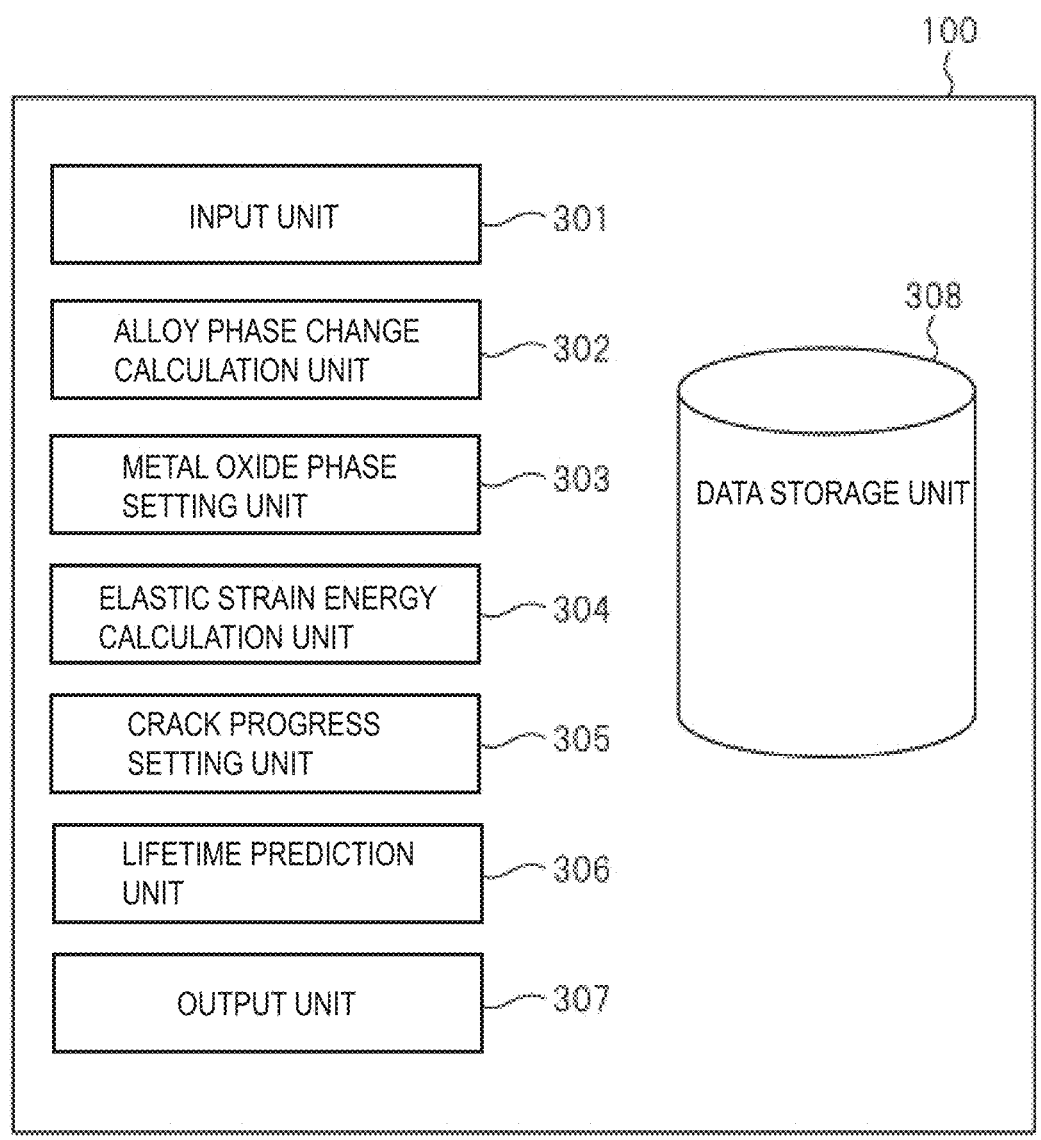
FIG. 5 is a functional block diagram showing a functional configuration of the reliability prediction device.

FIG. 5 is a functional block diagram showing a functional configuration of the reliability prediction device of the semiconductor device.

In FIG. 5, the reliability prediction device 100 in the present embodiment includes an input unit 301, an alloy phase change calculation unit 302, a metal oxide phase setting unit 303, an elastic strain energy calculation unit 304, a crack progress setting unit 305, a lifetime prediction unit 306, an output unit 307, and a data storage unit 308.

The input unit 301 includes an electrode pad main component composed of aluminum is formed in the semiconductor chip, and is configured to input a processed image at the bonding portion between the bonding wire mainly composed of copper. The processed image input to the input unit 301 may be generated by the reliability prediction device 100, or a processed image generated by another processed image generation device other than the reliability prediction device 100 may be input from the input unit 301.

For example, the processed image input to the input unit 301 is created as follows. That is, first, a semiconductor device sample is extracted, a cross section of the extracted sample is processed by FIB (Focused Ion Beam), and then structural analysis and elemental analysis of the bonding portion are performed by SEM, STEM, EDX, and the like. Then, based on the structural analysis and elemental analysis of the bonding portion, to create a processed image by color coding for a plurality of alloy phases constituting the bonding portion.

The assumed temperature and storage time in the simulation may be input information every time, but it is also possible to write it directly in the program.

Figure 6A:
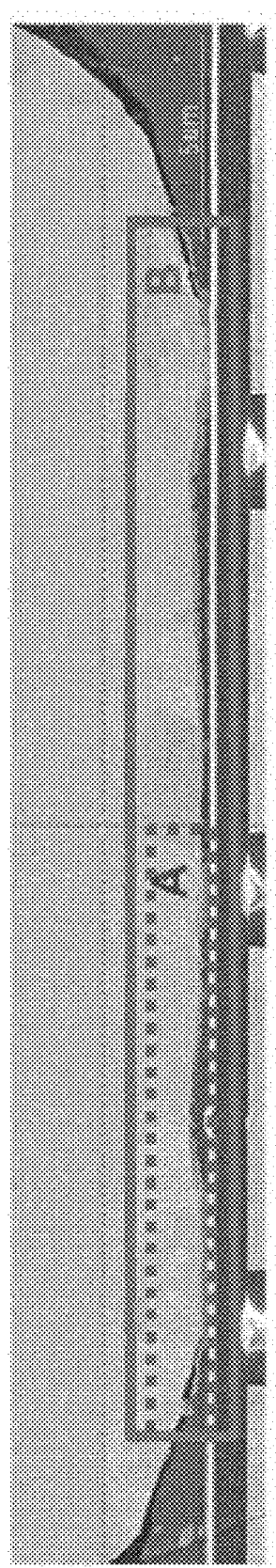
FIG. 6A is a diagram showing an "initial analysis image" obtained by performing an analysis image by SEM, STEM or the like at the bonding portion between the pad and the bonding wire and an elemental analysis by EDX or the like. Also.

Specifically, FIG. 6A is a diagram showing an "initial analysis image" obtained by performing an analysis image by SEM, STEM or the like at the bonding portion between the pad and the bonding wire and an elemental analysis by EDX or the like. Here, in FIG. 6A, "region B" is a region including the entire bonding portion, and is, for example, a region in which the entire length of the bonding portion is 30 µm. On the other hand, "region A" shows a partial region of the bonding portion, in particular, shows a region from one end region of the bonding portion to the center region. For example, in the "region B", the bonding portion width is 1.875 µm, and the bonding length is 15 µm. In the present embodiment, the analysis image of the "region B" can be used as the "initial analysis image" or the analysis image of the "region A" can be used. However, from the viewpoint of shortening the calculation time for performing the simulation, it is desirable to use the analytical image of the "region A" as the "initial analysis image" in consideration of symmetry.

Figure 6B:
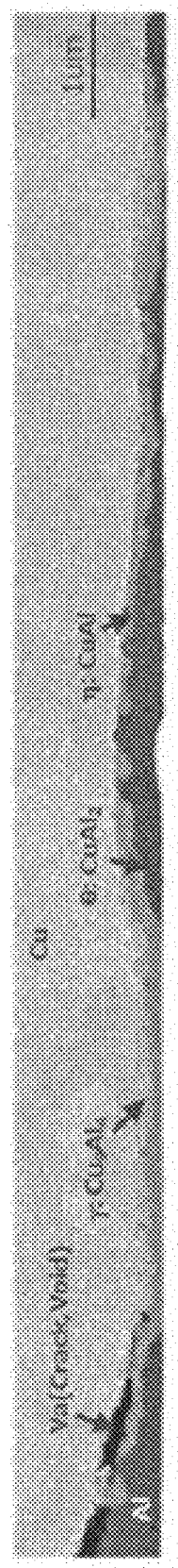
FIG. 6B is a diagram showing by enlarging a partial region of the "initial analysis image".

FIG. 6B is a diagram showing by enlarging the analysis image of the "region A". In FIG. 6B, as a plurality of alloying phases, together with CuAl phase, $Cu_9Al_4$ phase and $CuAl_2$ phase is included, also includes cracks (voids), these alloying phase and cracks are shown in different shade regions (gray scale region).

Figure 7:
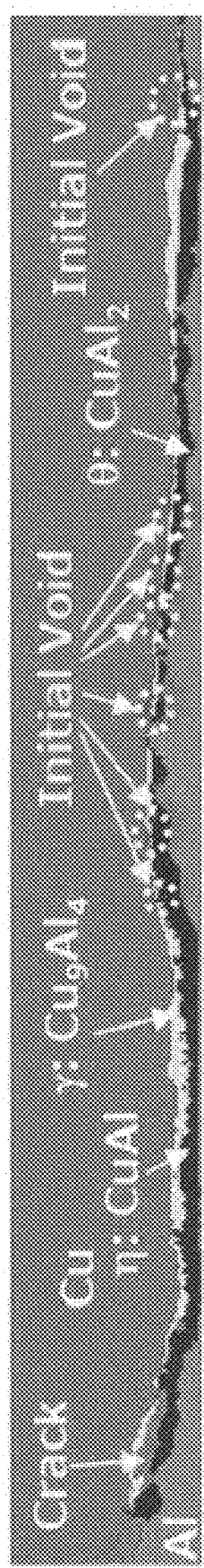
FIG. 7 is a diagram showing a "processed image" obtained by applying coloring to the "initial analysis image" shown in FIG. 6B.

The thus obtained "initial analysis image" shown in FIG. 6B is color-coded so that a plurality of alloy phases and cracks can be clearly identified by using image software, for example. Specifically, FIG. 7 is a diagram showing a "processed image" obtained by applying coloring to the "initial analysis image" shown in FIG. 6B. However, in FIG. 7, since coloring cannot be shown, a plurality of alloy phases and cracks are shown in gray regions, but in the actually used "processed image", a "processed image" in which FIG. 7 is colored is created.

The "processed images" created as described above are input to the input unit 301 of the reliability prediction device 100, and then stored in the data storage unit 308.

The alloy phase change calculation unit 302 is configured such that the alloy phase change calculation unit 302 calculates the change of each of the plurality of alloy phases at the bonding portion, with respect to the "processed image" stored in the data storage unit 308, by applying a phase field method to the processed image. More specifically, the alloy phase change calculating unit 302 is configured to calculate enlargement or reduction of "CuAl phase", "$Cu_9Al_4$ phase" and "$CuAl_2$ phase" included in a plurality of alloy phases together with copper and aluminum. Here, the phase field method is a method of calculating the free energy of a defined phase, causing a phase having a small free energy to grow as a stable phase, reducing the phase having a large free energy as an unstable phase, and calculating the growth or reduction of a plurality of alloy phases and the change of the element concentration in consideration of the element concentration based on the diffusion of atoms constituting the phase. The alloy phase change calculation unit 302 in the present embodiment is configured to generate "processed images" reflecting the phase changes of the "CuAl phase", "$Cu_9Al_4$ phase" and "$CuAl_2$ phase" at the bonding portion by using the phase-field method.

The metal oxide phase setting unit 303 is configured such that the metal oxide phase setting unit 303 sets the metal oxide phase at a region (crack contact region) of the specific alloy phase, if there are the crack and the specific alloy phase that is in contact with the crack, in the "processed image" in which the change of each of the plurality of alloy phases calculated by the alloy phase change calculation unit 302 is reflected. Here, the crack is in contact with the region. For example, the metal oxide phase setting unit 303 is configured to set the crack contact area of the crack contact area of $Cu_9Al_4$ phase, when the crack is present and $Cu_9Al_4$ phase in contact with the crack is present. In other words, in the metal oxide phase setting unit 303, as described in <GROWTH MECHANISM OF CRACK>, the initial crack is present at the bonding portion, in the region where the initial crack and $Cu_9Al_4$ phase is in contact, based on the knowledge that the crack-exposed region of $Cu_9Al_4$ phase is formed the aluminum oxide phase ($Al_2O_3$ phase) is formed, in the processed image, the initial crack and $Cu_9Al_4$ phase recognizes the region in contact, the aluminum oxide phase is set in this region.

The elastic strain energy calculation unit 304 is configured such that the elastic strain energy calculation unit 304 calculates the elastic strain energy at each of the specified portions of the bonding portion, based on a calculating result of the change of each of the plurality of alloy phases by the alloy phase change calculation unit 302 and a setting result of the metal oxide phase by the metal oxide phase setting unit 303.

The elastic strain energy calculation unit 304 is configured, for example, such that the elastic strain energy calculation unit 304 calculates the elastic strain energy at each of the specified portions of the bonding portion, while considering an external stress based on the difference in the thermal expansion coefficient between the semiconductor chip and the sealing body by the finite element method and the stress due to internal strain caused by crystal lattice mismatch and elastic modulus difference at the bonding portion where a plurality of alloy phases with different crystal structures calculated by the phase field method coexist. Here, "each specified point" is, for example, a mesh coordinate (element point) in the simulation.

The crack progress setting unit 305 is configured such that the crack progress setting unit 305 sets a progress of the crack at the bonding portion, based on the elastic strain energy calculated by the elastic strain energy calculation unit 304. Specifically, the crack progress setting unit 305 is configured to set the progress of the crack at a place having the elastic strain energy exceeding the threshold value when the elastic strain energy exceeding the threshold value exists among the elastic strain energy at each designated place. At this time, for example, the aluminum oxide phase is brittle as compared with the alloy phase, since the elastic modulus is large, likely to cause an increase in the elastic strain energy, as compared with other alloy structures, there is a property that easily exceed the threshold value of the elastic strain energy. For example, the threshold value is set to an optimized value by comparing the actual condition observation and simulation at the initial reliability of about 1000 hours, and is used for reliability prediction for a long time of 1000 hours or more.

The lifetime prediction unit 306 is configured such that the lifetime prediction unit 306 predicts a lifetime of the semiconductor device, based on the progress of the crack set by the crack progress setting unit 305. For example, the lifetime prediction unit 306, the length of the crack due to the progress of the crack is configured to predict the time that has reached the preset length and the lifetime of semiconductor device. At this time, the set length used in the lifetime prediction unit 306 is a length corresponding to the electrical open. In other words, the lifetime prediction unit 306 determines that semiconductor device has reached the end of its service lifetime, considering that when the length of the crack reaches a length corresponding to the electrically open state, semiconductor device will not operate normally. Predicting the lifetime of the semiconductor device is also to predict the growth of the length of the crack (crack length).

The output unit 307, every elapsed time set in advance, or, for each set interval of Time1 to be described later, Time2, the processing result of the alloy phase change calculation unit 302, the processing result of the metal oxide phase setting unit 303, the processing result of the elastic strain energy calculation unit 304, the processing result of the crack progress setting unit 305 either, or outputs all. Further, it outputs the lifetime predicted by the lifetime prediction unit 306.

As described above, the reliability prediction device 100 in the present embodiment is configured.

<Operation of Reliability Prediction Device (Reliability Prediction Method)>

Next, the operation of the reliability prediction device 100 will be described.

Figure 8:
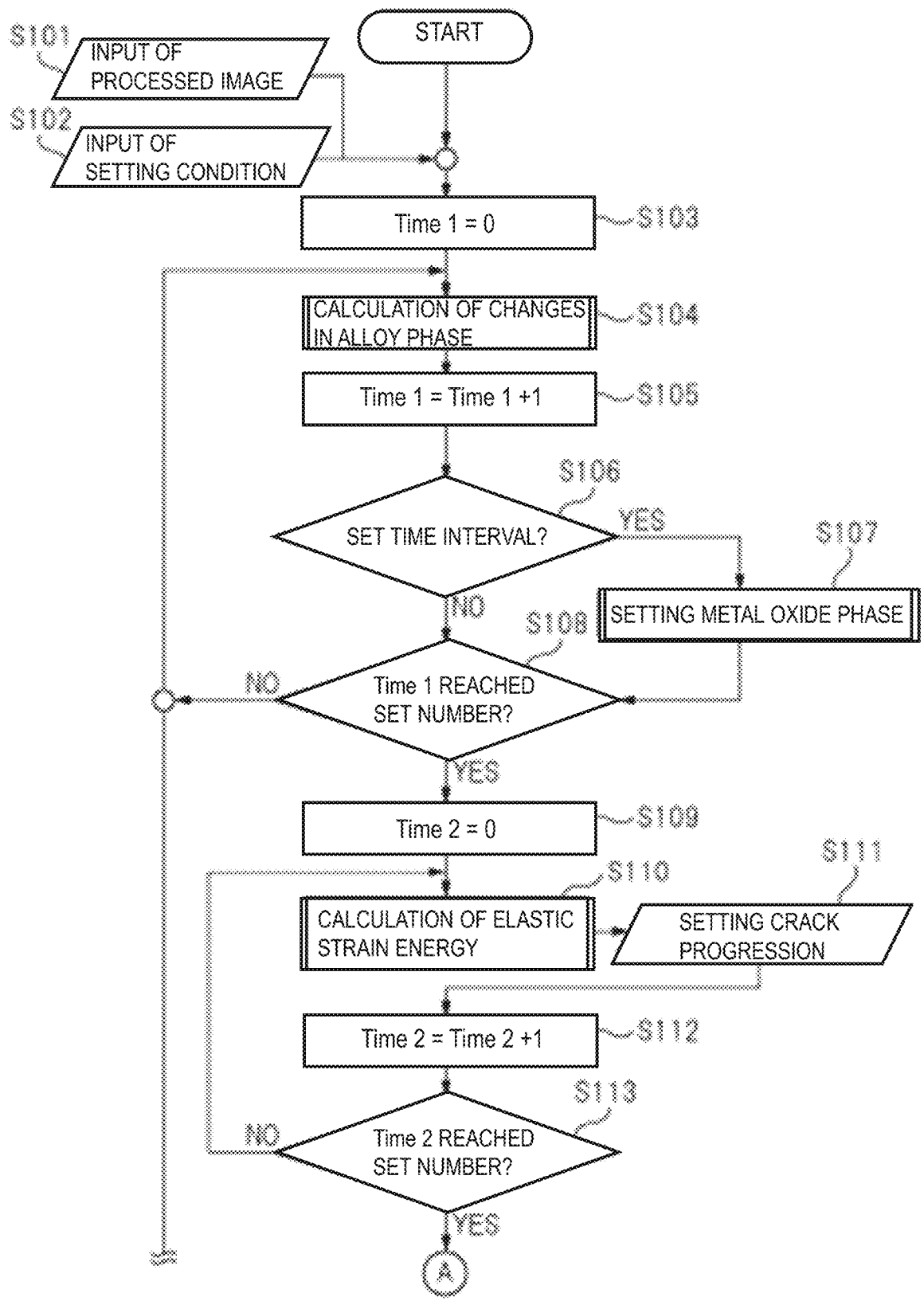
FIG. 8 is a flowchart for explaining an operation of the reliability prediction device.
Figure 9:
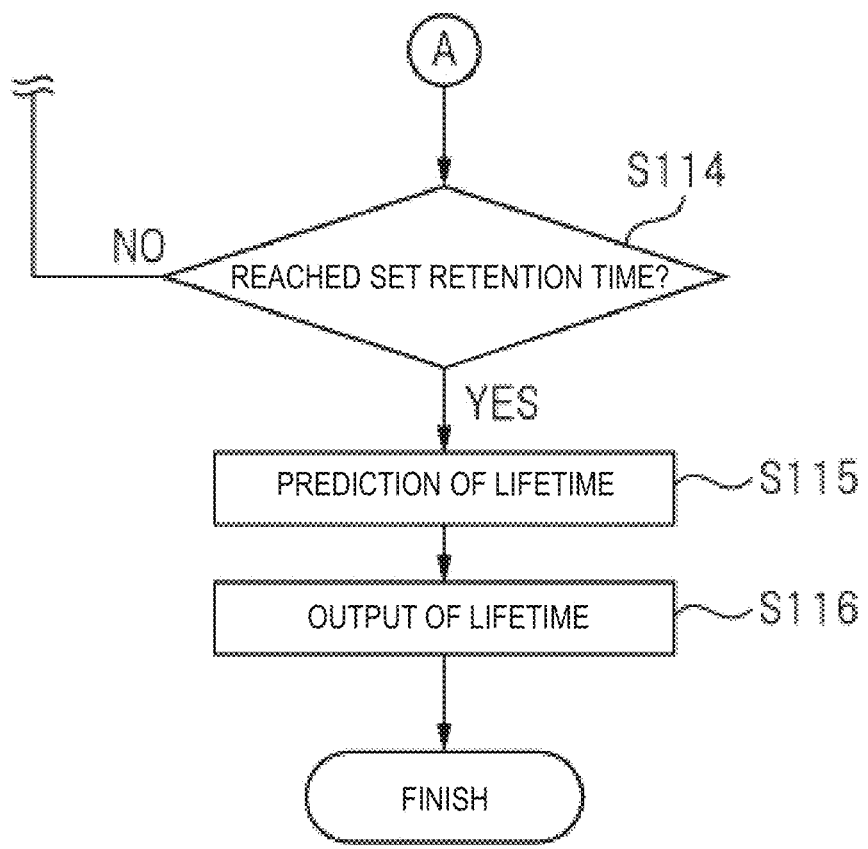
FIG. 9 is a flowchart for explaining an operation of the reliability prediction device.

FIGS. 8 and 9 are flowchart for explaining the operation of the reliability prediction device.

In FIG. 8, first, the input unit 301 inputs an electrode pad main component composed of aluminum is formed in the semiconductor chip, a processed image at the bonding portion between the bonding wire mainly composed of copper (S101). Furthermore, the input unit 301 inputs the setting conditions for executing the simulation (3102). For example, as the setting conditions, the number of loops in the case where the calculation calculate of the change of the alloy phase is executed in the first subroutine, the interval in the case where the setting of the metal oxide phase (corrosion reaction calculation) is executed in the second subroutine, the number of loops in the case where the calculation operation of the elastic strain energy is executed in the third subroutine, and the like can be given.

As setting conditions for executing simulations, parameters such as external stress as a control factor, mobility of grain boundaries as a material parameter, partial pressure of $CuSO_4$ affecting a corrosion-reaction rate, density of $SO_2$, threshold value of elastic strain energy, and the like are also set. The assumed temperature and storage time in the simulation may be entered before the simulation each time, but it is also possible to write it directly in the program.

Further, the processing image and the setting condition are stored in the data storage unit 308.

Next, "Time1=0" is set (S103). Then, the alloy phase change calculation unit 302, with respect to the processed image stored in the data storage unit 308, by applying a phase field method, calculates a change in a plurality of alloy phases at the bonding portion (S104). More specifically, the alloy phase change calculation unit 302 calculates the change with time of enlargement or reduction of the "CuAl phase", "$Cu_9Al_4$ phase" and "$CuAl_2$ phase" included in the plurality of alloy phases based on the free energies of the respective alloy phases calculated using the phase-field method.

Then, after "Time1=Time1+1", it is determined whether or not the set time interval has been reached (S106). When the set time interval is reached, the initial crack is present at the bonding portion, in the region where the initial crack and $Cu_9Al_4$ phase is in contact, in order to reflect the corroding reaction that $Al_2O_3$ phase is formed by the resistance to the crack-exposed region of $Cu_9Al_4$ phase, the metal oxide phase setting unit 303, in the processed image, the initial crack and $Cu_9Al_4$ phase recognizes the region in contact with, sets the aluminum oxide phase in this region (S107). On the other hand, when the set time interval is not reached, the aluminum oxide phase is not set by the metal oxide phase setting section 303. Thereafter, it is determined whether or not "Time1" has reached the set number (S108). When "Time1" does not reach the set number, the calculation by alloy phase change calculation unit 302 is repeated. That is, the arithmetic processing by the alloy phase change calculation unit 302 is a subroutine processing that is repeated by the set number of times of "Time1". On the other hand, the calculation process by the metal oxide phase setting unit 303 is a subroutine process which is repeated at "set time intervals".

This configuration takes into account the difference between the time scale at which the alloy phase changes and the time scale at which the aluminum oxide phase is formed by the corrosion reaction. For example, the set number of times of Time1 is 100, and the set time interval is a time interval for executing the process only when Time1 is a multiple of 10. In this case, the subroutine processing by the metal oxide phase setting unit 303 is repeated 10 times while the subroutine processing by the alloy phase change calculation unit 302 is repeated 100 times. This makes it possible to make the time scale at which the alloy phase changes different from the time scale at which the aluminum oxide phase is formed by the corrosion reaction. In this way, the present embodiment can incorporate sub-routine processes that differ in time scale from one another into simulations.

Incidentally, in the region where the initial crack and the "$Cu_9Al_4$ phase" is in contact, at the time of "Time1=0", if it is considered that the previously-formed ($Al_2O_3$ phase), in the flowchart of FIG. 8, after the (S101) and (S102), and, before (S103) or between (S103) and (S104), may be provided a step of setting the metal oxides phase of (S107).

Next, if the "Time1" has reached the set number, after setting the "Time2=0" (S109), the elastic strain energy calculation unit 304, based on the setting result of the metal oxide phase in the calculation result and the metal oxide phase setting unit 303 of the plurality of alloy phase changes in the alloy phase change calculation unit 302, the bonding portion to calculate the elastic strain energy at each specified location (S110). For example, the elastic strain energy calculation unit 304 includes an external stress set, while considering the stress due to internal distortion generated due to the difference in mismatch and elastic modulus of the crystal lattice at the bonding portion in which a plurality of alloy phases having different crystal structures are mixed, each of the specified portions of the bonding portion to calculate the elastic strain energy.

Subsequently, the crack progress setting unit 305, based on the elastic strain energy calculated by the elastic strain energy calculation unit 304, sets the progress of the crack in the bonding portion (S111). Specifically, the crack progress setting unit 305, if there is an elastic strain energy exceeding a predetermined threshold value in the elastic strain energy at each specified location, sets the progress of the crack at a location having an elastic strain energy exceeding the threshold value.

Then, after "Time2=Time2+1" (S112), it is determined whether or not "Time2" has reached the set number (S113). When "Time2" does not reach the set number, the calculation by the elastic strain energy calculation unit 304 is repeated. That is, the calculation processing by the elastic strain energy calculation unit 304 is a subroutine processing that is repeated by the set number of times of "Time2". On the other hand, when "Time2" has reached the set number, it is determined whether or not a preset set holding time has been reached (S114). If it has not reached the set holding time which is set in advance, the process returns to S104, the arithmetic processing by the alloy phase change calculation unit 302 (first subroutine processing) and the metal oxide phase setting unit 303 (second subroutine processing) and the elastic strain energy calculation unit 304 (third subroutine processing) and the calculation processing by the crack progress setting unit 305 is repeated.

On the other hand, if it has reached the set holding time which is set in advance, the lifetime prediction unit 306 predicts the lifetime of semiconductor device based on the progress of the crack set by the crack progress setting unit 305 (S115). For example, the lifetime prediction unit 306 predicts the time when the length of the crack due to the progress of the crack has reached the preset length as the lifetime of semiconductor device. Specifically, the lifetime prediction unit 306 determines that semiconductor device has reached the end of its service lifetime, considering that when the length of the crack reaches a length corresponding to the electrically open state, semiconductor device will not operate normally. Thereafter, the output unit 307 outputs the lifetime predicted by the lifetime prediction unit 306 (S116). As described above, operating the reliability prediction device 100 in the present embodiment realizes the reliability prediction method of semiconductor device.

According to the present embodiment, for example, at an ambient temperature of 200° C., the simulation results of the change and crack length of the alloy phase at an assumed holding time of 1200 hours and after 1600 hours, as compared with the observation results of the actual bonding portion, it was possible to confirm that there is no difference. In addition, the reliability predicted device 100 in the present embodiment could be operated until, for example, after about 3000 hours, the crack was extended to a length equal to the length of the bonding portion to determine that the bonding portion was broken.

Figure 10A:
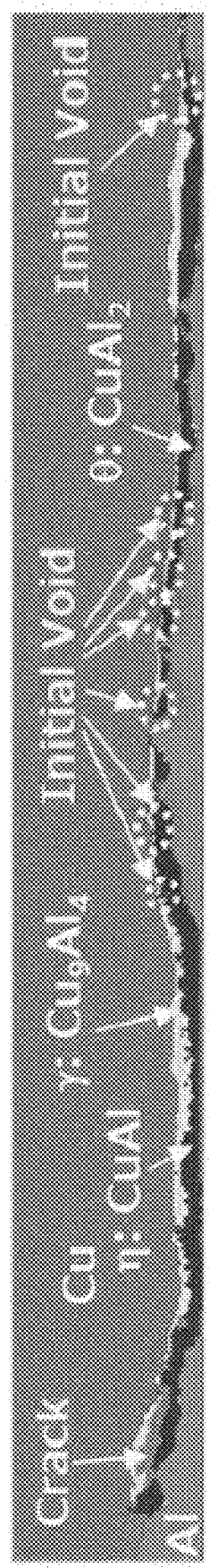
FIG. 10A is a diagram showing an initial "processed image"
Figure 10B:
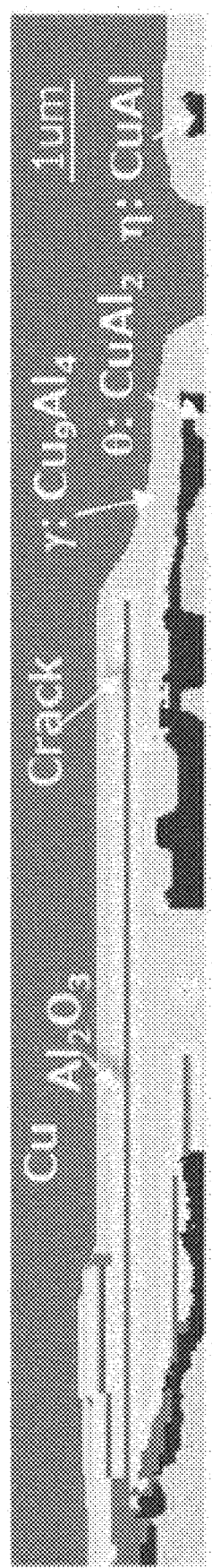
FIG. 10B is a diagram showing a "processed image" after 1200 hours elapsed.
Figure 10C:
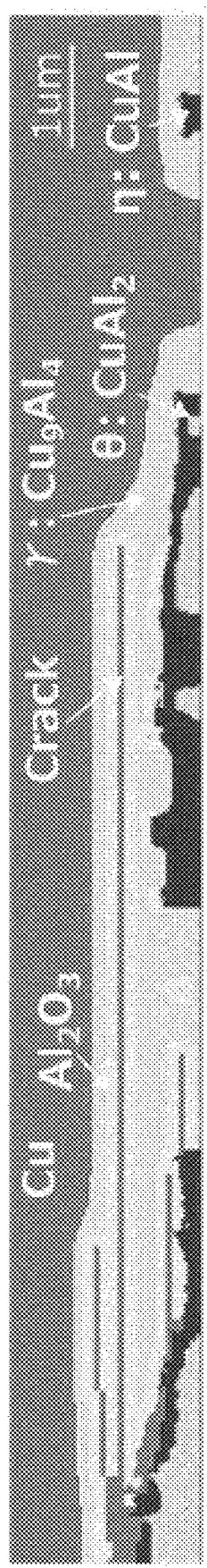
FIG. 10C is a diagram showing a "processed image" after 1600 hours elapsed.

FIGS. 10A to 10C are a diagram showing a change of the "processed image" when simulated in the present embodiment. In particular, FIG. 10A shows an initial "processed image", FIG. 10B shows a "processed image" after 1200 hours elapsed, and FIG. 10(*c*) shows a "processed image" after 1600 hours elapsed. As shown in FIGS. 10A to 10C, it can be seen that the progress of the crack is simulated over time.

<Reliability Prediction Program>

The reliability prediction method implemented in the above reliability prediction device 100 can be realized by a reliability prediction program that cause a computer to execute a reliability prediction process.

For example, in the reliability prediction device 100 including the computer shown in FIG. 4, a reliability prediction program in the present embodiment can be introduced as one of the programs 202 stored in the hard disk device 112. The reliability prediction method in the present embodiment can be realized by causing a computer, which is the reliability prediction device 100, to execute the reliability prediction program.

The reliability prediction program that causes a computer to execute each process for producing data relating to reliability prediction process can be recorded and distributed on a computer readable recording medium. The recording medium includes, for example, a magnetic storage medium such as a hard disk or a flexible disk, an optical storage medium such as a CD-ROM or a DVD-ROM, and a hardware device such as a non-volatile memory such as a ROM or an EEPROM.

EFFECTS IN EMBODIMENTS

According to the present embodiment, the lifetime of semiconductor device can be predicted based on the crack progress simulation. Therefore, the lifetime of semiconductor device can be predicted in a short period of time without relying on long-time accelerated reliability tests up to the criterion. As a result, according to the present embodiment, it is possible to shorten the time required to develop products.

According to the present embodiment, it is possible to shorten the development time of the products, and therefore it is possible to reduce the cost of semiconductor device by reducing the man-hours and the development cost.

In particular, according to the present embodiment, it is possible to predict the reliability (lifetime) of the bonding portion based on the early images of the bonding portion obtained from the actual sample. Therefore, the prediction accuracy can be improved.

Further, through the simulation, as a result of being able to compare the initial "processed image" and the "processed image" after the desired elapsed time, it is possible to visualize the growth of changes and cracks in the alloy phase.

Furthermore, by utilizing the technical idea in the present embodiment, the following effects can be obtained. For example, by confirming the correlation between the crack length observed at a timing of about 1200 hours in a sample stored in an accelerated reliability test such as 200° C. and the simulation results in the present embodiment, the parameter setting value used in the simulation (coefficient setting value) can be optimized to improve the prediction accuracy of the growth rate and the lifetime of the crack. In addition, by utilizing the technical philosophy in the present embodiment, changes in the alloy phase and the progress of cracks can be visualized and predicted after a long storage period, such as 3000 hours and 5000 hours later.

Furthermore, by utilizing the technical philosophy (simulation technology) of the present embodiment, it is possible to propose countermeasures using simulations and predict the effects of these measures as early as possible in the event of a defect of the bonding portion, as well as to predict the effects of changes in the components and processes through simulations even when the components and processes are changed.

<Application to Structural Design>

For example, prior to the realization of the technical idea in the present embodiment, long-term reliability tests were required in the structural design of the bonding portion, and therefore long-term development times were required in the structural design of the bonding portion. In the observation of the bonding portion, it is difficult to verify the mechanism leading to the failure of the bonding portion. In other words, the basis for the structural design of the bonding portion could only be proved by long-term reliability tests.

In this regard, applying the technical philosophy in the present embodiment to the structural design of the bonding portion eliminates the need for long-term reliability testing for the structural design of the bonding portion. As a result, by designing the structure of the bonding portion using the technical idea in the present embodiment, it is possible to shorten the development time. Furthermore, since simulation can verify the mechanism leading to the failure of the bonding portion, the impact on the structural design of the bonding portion is large in that it is possible to prove the basis of the structural design of the bonding portion even without relying on long-term reliability tests.

In the following, an example of applying the reliability prediction technique to the structural design of the bonding portion will be described.

Figure 11:
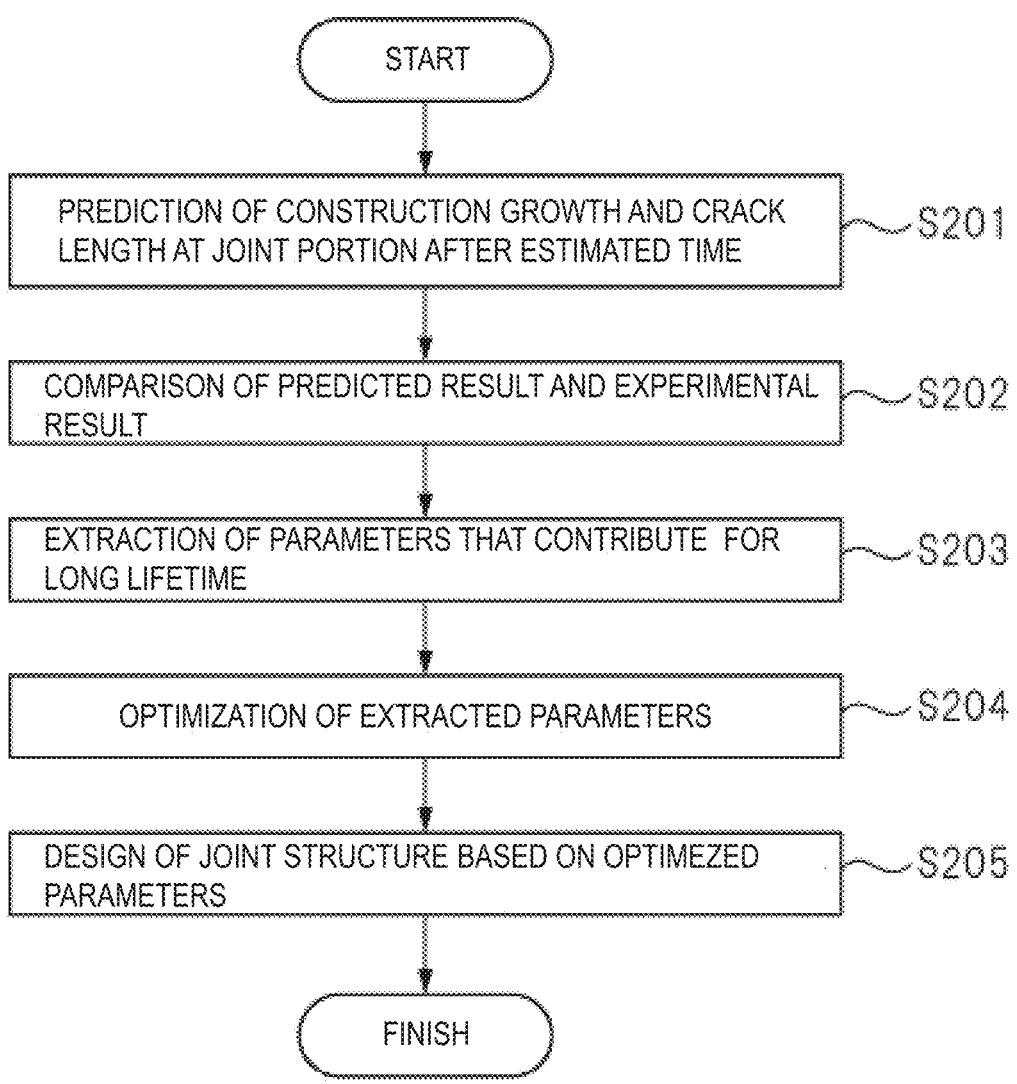
FIG. 11 is a flowchart showing a flow of performing a structural design of the bonding portion.

FIG. 11 is a flowchart showing a flow of performing the structural design of the bonding portion.

In FIG. 11, firstly, the structure growing and the crack length of the bonding portion are predicted by the reliability prediction technique (simulating technique) in the present embodiment at any environmental temperatures and storage times (S201). Next, for tissue growth and crack length, the predicted results at the same environmental temperature and storage time are compared with the experimental results (S202). For example, parameters for determining the factor effects are extracted based on the phase thicknesses, areas, and positional relationships with cracks for each of the alloying phases ("CuAl phase," "Cu$_9$Al$_4$ phase," and "CuAl$_2$ phase") grasped from the initial "processed images" of the bonding portions. Then, after allocating the extracted parameters to "L18 Equal Orthogonal Table", by comparing the experimental results obtained using the Design of Experiments/Taguchi Method with the simulated results in the present embodiment, the factor effect on the growth rate of cracks is obtained.

Examples of the parameters include the number of loops when the calculation calculate of the change of the alloy phase is performed in the first subroutine, the interval when the setting of the metal oxide phase (corrosion reaction calculation) is performed in the second subroutine, and the number of loops when the calculation operation of the elastic strain energy is performed in the third subroutine. Other examples of parameters include external stress as a control factor, mobility of grain boundary as a material parameter, partial pressure of CuSO$_4$ affecting erosion kinetics, concentration of SO$_2$, threshold of an elastic strain energy, and the like.

Subsequently, based on the factorial effect obtained by comparing the predicted results with the experimental results, the growth rate of the crack length is suppressed to extract the parameters that contribute to the long lifetime (S203). Then, after optimizing the extracted parameters, the predicted lifetime is confirmed (S204), and the optimal parameters are reflected in the bonding structure of the bonding portion (S205). In this way, the bonding structure can be designed using simulated techniques in the present embodiment.

According to such a structural design method, since a long-term reliability test is unnecessary, it is possible to shorten the development time. And, the verification of the mechanism which leads to the defect of the bonding portion can be carried out by the simulation technique.

The invention made by the present inventor has been described above in detail based on the embodiment, but the present invention is not limited to the embodiment described above, and it is needless to say that various modifications can be made without departing from the gist thereof.

The embodiment includes the following aspects.

Additional Statement 1

A reliability prediction device of a semiconductor device comprising:
an input unit for inputting a processed image at a bonding portion between an electrode pad and a bonding wire, the electrode pad being mainly comprised of aluminum formed on a semiconductor chip, and the bonding wire being mainly comprised of copper;
an alloy phase change calculation unit for calculating a change of each of a plurality of alloy phases at the bonding portion, by applying a phase field method to the processed image;
a metal oxide phase setting unit for setting a metal oxide phase at a region of a specific alloy phase, if there are a crack and the specific alloy phase that is in contact with the crack, in the processed image in which the change of each of the plurality of alloy phases calculated by the alloy phase change calculation unit is reflected, the crack being in contact with the region;
an elastic strain energy calculation unit for calculating an elastic strain energy at each of specified portions of the bonding portion, based on a calculating result of the change of each of the plurality of alloy phases by the alloy phase change calculation unit and a setting result of the metal oxide phase by the metal oxide phase setting unit;
a crack progress setting unit for setting a progress of the crack at the bonding portion, based on the elastic strain energy calculated by the elastic strain energy calculation unit; and
a lifetime prediction unit for predicting a lifetime of the semiconductor device, based on the progress of the crack set by the crack progress setting unit.

Additional Statement 2

A program that causes a computer to predict a reliability prediction of a semiconductor device, comprising:
an input process for inputting a processed image at a bonding portion between an electrode pad and a bonding wire, the electrode pad being mainly comprised of aluminum formed on a semiconductor chip, and the bonding wire being mainly comprised of copper;
an alloy phase change calculation process for calculating a change of each of a plurality of alloy phases at the bonding portion, by applying a phase field method to the processed image;
a metal oxide phase setting process for setting a metal oxide phase at a region of a specific alloy phase, if there are a crack and the specific alloy phase that is in contact with the crack, in the processed image in which the change of each of the plurality of alloy phases calculated by the alloy phase change calculation process is reflected, the crack being in contact with the region;
an elastic strain energy calculation process for calculating an elastic strain energy at each of specified portions of the bonding portion, based on a calculating result of the change of each of the plurality of alloy phases by the alloy phase change calculation process and a setting result of the metal oxide phase by the metal oxide phase setting process;
a crack progress setting process for setting a progress of the crack at the bonding portion, based on the elastic strain energy calculated by the elastic strain energy calculation process; and
a lifetime prediction process for predicting a lifetime of the semiconductor device, based on the progress of the crack set by the crack progress setting process.

Additional Statement 3

A recording medium that can read the program described in the additional statement 2 with a computer.

What is claimed is:
1. A method for predicting a reliability of a semiconductor device, comprising:
(a) inputting a processed image at a bonding portion between an electrode pad and a bonding wire, the electrode pad being mainly comprised of aluminum formed on a semiconductor chip, and the bonding wire being mainly comprised of copper;
(b) calculating a change of each of a plurality of alloy phases at the bonding portion, by applying a phase field method to the processed image;
(c) setting a metal oxide phase at a region of a specific alloy phase, if there are a crack and the specific alloy phase that is in contact with the crack, in the processed image in which the change of each of the plurality of alloy phases calculated in the (b) is reflected, the crack being in contact with the region;

(d) calculating an elastic strain energy at each of specified portions of the bonding portion, based on a calculating result of the change of each of the plurality of alloy phases in the (b) and a setting result of the metal oxide phase in the (c);

(e) setting a progress of the crack at the bonding portion, based on the elastic strain energy calculated in the (d); and (f) predicting a lifetime of the semiconductor device, based on the progress of the crack set in the (e).

2. The method according to claim 1, wherein in the (f), it is predicted that a time that a length of the crack due to the progress of the crack has reached a preset length is the lifetime of the semiconductor device.

3. The method according to claim 1, wherein the plurality of alloy phases includes a CuAl phase, a $Cu_9Al_4$ phase and a $CuAl_2$ phase.

4. The method according to claim 3,
wherein the specific alloy phase is the $Cu_9Al_4$ phase, and
wherein the metal oxide phase is an aluminum oxide phase.

5. The method according to claim 4, wherein in the (d), if there is an elastic strain energy exceeding a preset threshold value, among the elastic strain energy at each of the specified portions, the progress of the crack is set at a portion having the elastic strain energy exceeding the preset threshold value.

6. The method according to claim 5, wherein the preset threshold value at the aluminum oxide phase is set lower than the preset threshold value at each of the plurality of alloy phases.

7. The method according to claim 1,
wherein the (b) is a first subroutine step which is to be repeated by a first setting number of times,
wherein the (c) is a second subroutine step which is to be repeated by a second setting number of times,
wherein the (d) is a third subroutine step which is to be repeated by a third setting number of times,
wherein the (e) is included in the third subroutine step, and
wherein the (b), the (c), the (d) and the (e) are repeated.

8. The method according to claim 1, wherein an image region of the processed image is a partial region of the bonding portion.

9. The method according to claim 8, wherein the image region of the processed image is from one end partial region of the bonding portion to a central region of the bonding portion.

10. The method according to claim 2, wherein the preset length used in the (f) is a length corresponding to an electrical open.

11. The method according to claim 1, further comprising:
(g) extracting a parameter that contributes to a long lifetime from a plurality of parameters used in the method for predicting the reliability of the semiconductor device, by comparing a predicted result by the (f) with an experimental design method or an experimental result by the Taguchi method;
(h) optimizing the parameter extracted in the (g); and
(i) designing a bonding structure of the electrode pad and the bonding wire, based on the parameter optimized in the (h).

* * * * *